United States Patent [19]

Matsubara

[11] Patent Number: 5,034,245
[45] Date of Patent: Jul. 23, 1991

[54] METHOD OF PRODUCING CONNECTION ELECTRODES

[75] Inventor: Hiroshi Matsubara, Tenri, Japan

[73] Assignee: Sharp Kabushiki Kaisha, Osaka, Japan

[21] Appl. No.: 485,745

[22] Filed: Feb. 27, 1990

[30] Foreign Application Priority Data

Mar. 1, 1989 [JP] Japan ................... 1-50904

[51] Int. Cl.⁵ .............. B05D 3/06; B05D 5/12; B05D 5/00; B05D 1/36
[52] U.S. Cl. .................. 427/54.1; 427/44; 427/53.1; 427/56.1; 427/96; 427/205; 427/198; 427/199
[58] Field of Search ............. 427/54.1, , 53.1, 56.1, 427/44, 96, 197, 198, 199, 205, 375

[56] References Cited

U.S. PATENT DOCUMENTS

| | | | |
|---|---|---|---|
| 3,391,455 | 7/1968 | Hirohata et al. | 427/205 |
| 3,951,063 | 4/1976 | Schank | 427/198 |
| 4,049,844 | 9/1977 | Bolon et al. | 427/96 |
| 4,075,049 | 2/1978 | Wood | 427/199 |
| 4,327,124 | 4/1982 | DesMarais, Jr. | 427/205 |
| 4,401,686 | 8/1983 | Durand | 427/199 |
| 4,469,777 | 9/1984 | O'Neil | 427/96 |
| 4,572,764 | 2/1986 | Fan | 427/54.1 |
| 4,654,752 | 3/1987 | Kyle | 361/386 |
| 4,807,021 | 2/1989 | Okumura | 357/75 |
| 4,814,090 | 3/1989 | Ozawa | 427/96 |
| 4,863,757 | 9/1989 | Durand | 427/54.1 |

OTHER PUBLICATIONS

Patent Abstracts of Japan, vol. 12, No. 276 (p-737) Pub. #63-055,527, 7/1988 Fumihiro.
Patent Abstracts of Japan, vol. 12, No. 17 (E-574) Pub. #62-176,139 1/1988 Hironori.
Patent Abstracts of Japan, vol. 10, No. 369 (p-525) Pub. #61-161,536 12/86, Kazufumi et al.

*Primary Examiner*—Michael Lusignan
*Assistant Examiner*—Marianne L. Padgett
*Attorney, Agent, or Firm*—David G. Conlin; Robert M. Asher

[57] ABSTRACT

A connection electrodes producing method has a step of forming resin layer which can be softened after hardened, on a circuit substrate on which an electrode pattern is formed. Then, only the resin layer material on the electrode pattern is cured and left. Thereafter, conductive particles are adhered to only the resin layer on the electrode pattern by softening the resin layer and by scattering the conductive particles on the circuit substrate with the softened resin layer.

9 Claims, 4 Drawing Sheets

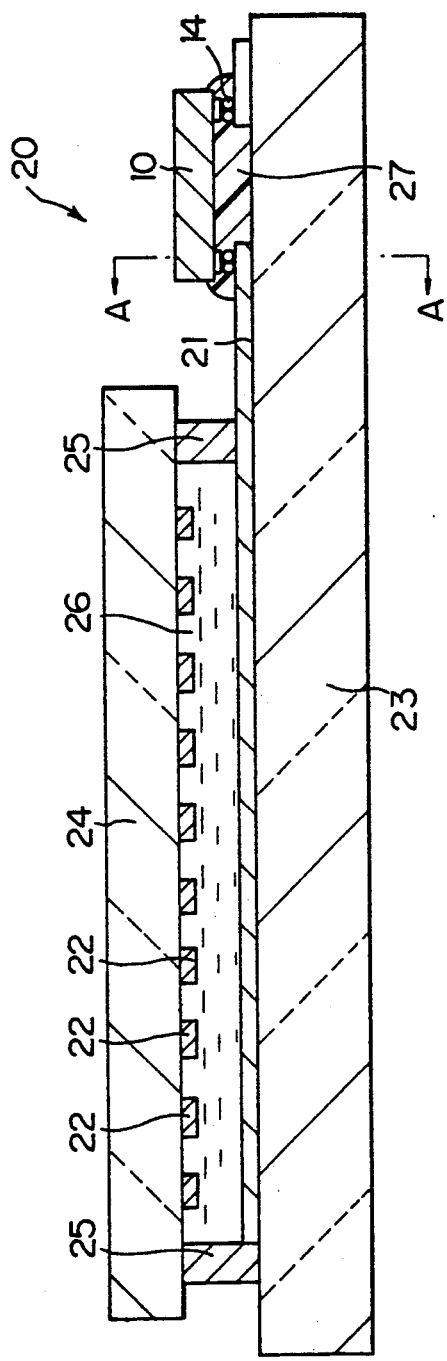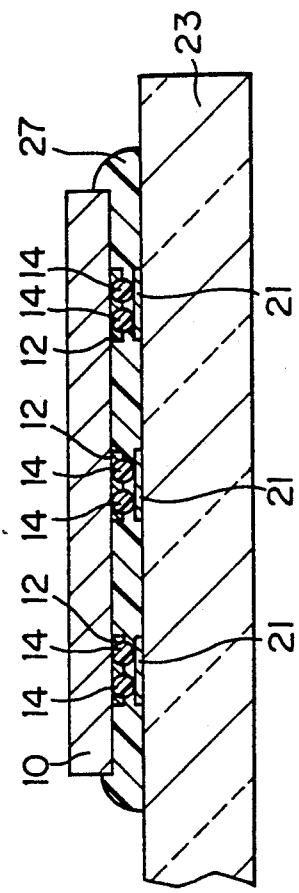

METHOD OF PRODUCING CONNECTION ELECTRODES

BACKGROUND OF THE INVENTION

1. Field of the Invention

The present invention relates to a method of producing connection electrodes for semiconductor integrated circuits, printed circuit substrates, glass substrates, flexible substrates, ceramic substrates or the like.

2. Description of the Related Art

It is known that soldering is utilized in a method of electrically connecting the connection electrodes of such as a semiconductor chip to those of another circuit substrate. In the method utilizing soldering, a solder layer is formed on the electrodes of either of the substrates to be connected by plating, printing or other techniques. The solder layer is then heated to a high temperature of the order of 200°-250° C., and fused with the electrodes of the other substrate for connecting purposes. In this method, accordingly, it is necessary to employ a metal, such as Au, Cu or Ni, having an affinity for solder.

However, it has been pointed out that such a high-temperature process utilizing soldering thermally damages circuit substrates and, in addition, the use of a metal having an affinity for solder leads to an increase in cost.

The present applicant is aware of a method of electrically connecting the connection electrodes by using an anisotropic conductive sheet which includes conductive particles dispersed in an adhesive. This method can be used to solve the problems of thermal damage and cost increase.

The anisotropic conductive sheet has anisotropy which exhibits electrical conductivity with respect to the direction in which pressure is applied to the sheet and also exhibits no electrical conductivity with respect to other directions. Specifically, in this method, such an anisotropic conductive sheet is inserted between electrodes, terminals or other portions to be connected. Then the portion of the sheet interposed between, for example, the electrodes, is pressed and heated in the direction of the thickness of the sheet, thereby forming the electrical connection between the electrodes.

The anisotropic conductive sheet is particularly suitable for use in connecting the terminal electrodes of a liquid crystal display panel of the type which employs ITO (Indium Tin Oxide) as wiring material. This is because that high-temperature heat should not be applied to such liquid crystal display panel.

The anisotropic conductive sheet has conductive particles dispersed throughout the entire resin serving as an adhesive. Accordingly, if adjacent electrode terminals are spaced close to one another an electrical short may occur due to the conductive particles.

SUMMARY OF THE INVENTION

It is therefore an object of the present invention to provide a method of producing connection electrodes which can prevent the occurrence of electrical shorts to improve the reliability of connection when connecting electrodes formed according to a micro pattern are connected.

In order to achieve the above object, according to the present invention, there is provided a method of producing connection electrodes, which includes the steps of forming a resin layer made of a resin material capable of being softened after being hardened, on a circuit substrate on which an electrode pattern is formed, curing only the resin material on the electrode pattern, leaving only the resin layer on the electrode pattern, and adhering conductive particles to only the resin layer on the electrode pattern by softening the resin layer and scattering the conductive particles on the circuit substrate with the softened resin layer.

According to the present invention, it is possible to dispose conductive particles on connection electrodes by a simple method. Accordingly, when handling micro electrode patterns, it is possible to improve the reliability with which the projections of respective electrodes which are formed of the conductive particles are connected to the electrodes of another circuit substrate by pressure bonding. In consequence, productivity increases and cost decreases.

In the present invention, the curing step preferably includes a step of effecting illumination with ultraviolet rays through a mask having an opening pattern corresponding to the electrode pattern.

The leaving step preferably includes a step of remove a non-cured part after the illumination with ultraviolet rays. This removing may be done by dissolving the non-cured part by a solvent.

The adhering step preferably includes a step of removing the conductive particles attached to the portion other than the electrode pattern.

This removing operation may be carried out after or simultaneously with the scattering the conductive particles.

The adhering step preferably includes a step of scattering on the circuit substrate conductive particles each having a diameter greater than the thickness of the softened resin layer.

The adhering step may include a step of scattering, on the circuit substrate, conductive particles each completely formed of metal.

The adhering step may include a step of scattering, on the circuit substrate, conductive particles each of which is formed of an elastomeric particle coated with a metallic layer.

Further objects and advantages of the present invention will be apparent from the following description of the preferred embodiments of the invention as illustrated in the accompanying drawings.

BRIEF DESCRIPTION OF THE DRAWINGS

FIG. 6 is a schematic cross-sectional view showing a liquid-crystal display device on which is mounted a semiconductor device formed according to any of the above embodiments of the present invention;

FIG. 7 is a cross-sectional view taken along line A—A;

DESCRIPTION OF THE PREFERRED EMBODIMENTS

Figure 1:
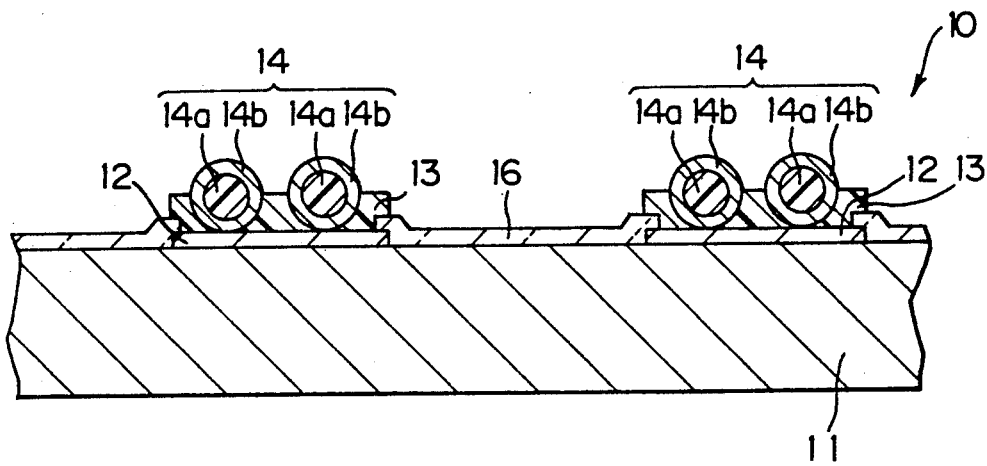
FIG. 1 is a schematic cross-sectional view showing a part of a semiconductor device including connection electrodes formed according to a preferred embodiment of the present invention.

FIG. 1 shows in cross section a part of a semiconductor device including connection electrodes formed according to a preferred embodiment of the present invention.

As shown in FIG. 1, a semiconductor device 10 includes a semiconductor substrate 11, connection electrodes 12, a resin layer 13 and conductive particles 14. The connection electrodes 12, the resin layer 13 and the conductive particles 14 are formed on the semiconductor substrate 11 in advance.

The connection electrodes 12 are each usually made of AlSi in which approximately 1% Si is added to Al. Since an extremely thin insulating oxide film of alumina or the like is formed over the surface of AlSi, resistance tends to easily increase at each connection.

Figure 2:
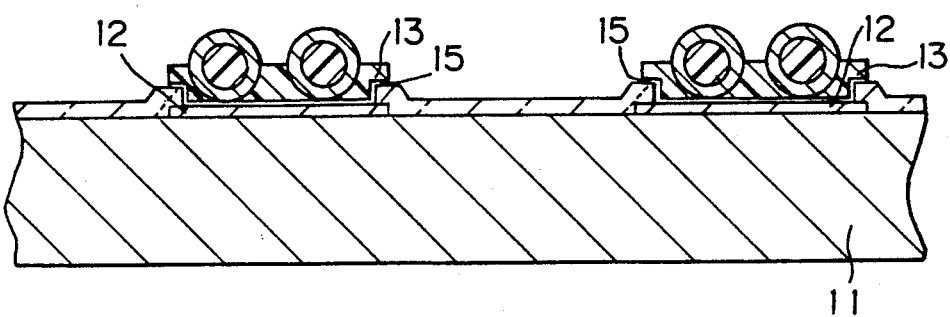
FIG. 2 is a schematic cross-sectional view showing a part of a semiconductor device including connection electrodes formed according to another embodiment of the present invention.

In order to decrease such connection resistance, as shown in FIG. 2, each AlSi electrode 12 may be coated with one or more metallic layers 15. The metallic layer 15 may be made of a metal selected from among Cr, Ti, W, Cu, Ni, Au, Ag, Pt, Pd and the like or an alloy of those metals. The coating may be carried out by depositing predetermined metal on the semiconductor device 10 by means of sputtering or electron-beam evaporation, forming a pattern by photolithography, and then selectively coating each electrode 12 with the metallic layer 15. Since Ni cannot be deposited directly on the electrode 12 made of AlSi by means of electroless plating, an alternative coating method may also be employed. One example method is carried out by selectively plating Pd on the electrode 12 and then substituting Ni for Pd by electroless plating to coat the electrode 12 with the metallic layer 15 of Ni.

A surface protecting layer 16 is formed over the area of the semiconductor device 10 on which no electrode 12 is formed. The surface protecting layer 16 is made from a layer of, for example, SiN, SiO$_2$ or polymide.

A resin layer 13 is formed over each of the electrodes 12 of the semiconductor device 10. The resin layer 13 is hardened by a method described later in a state wherein each conductive particle 14 is partially embedded in the resin layer 13. A part of the portion of the conductive particle 14 embedded in the resin layer 13 is held in contact with the surface of the electrode 12, while the other part protrudes from the resin layer 13. The resin layer 13 may be made of a resin material which can be softened even after being hardened, for example, a material selected from among synthetic resins such as acrylic resins, polyester resins, urethane resins, epoxy resins and silicone resins.

Each of the conductive particles 14 is formed by an elastomeric particle 14a made of polymeric material and a coating layer 14b made of conductive material, which layer 14b covers the surface of the respective elastomeric particle 14a. The material for the elastomeric particles 14a may be selected from among synthetic resins such as polyimide resins, epoxy resins and acrylic resins or synthetic rubbers such as silicone rubber, urethane rubber and the like. The conductive material for the coating layer 14b may be selected from among metals such as Au, Ag, Pt, Cu, Ni, C, In, Sn, Pb and Pd or an alloy of these metals. Each coating layer 14b may be made as one layer or a combination of two layers or more.

Figure 3:
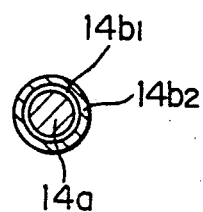
FIG. 3 is a cross-sectional view showing the structure of an example of a conductive particle.

If each coating layer 14b is to be formed as a combination of two layers or more, as shown in FIG. 3, it is preferable to form a metallic layer 14b1 made of a metal exhibiting excellent adhesiveness with respect to the elastomeric particle 14a, for example, Ni, and then to coat the metallic layer 14b1 with a metal layer 14b2 of Au in order to prevent oxidization of the above metal. This layer coating may be effected by utilizing deposition such as sputtering or electron-beam deposition or electroless deposition.

Figure 4:
FIG. 4 is a cross-sectional view showing the structure of another example of the conductive particle.

Alternatively, as shown in FIG. 4, the entire conductive particle 14 may be formed of a metal selected from among Au, Ag, Pt, Cu, Ni, C, In, Sn, Pb and Pd or an alloy of two or more of these metals.

Figure 5A:
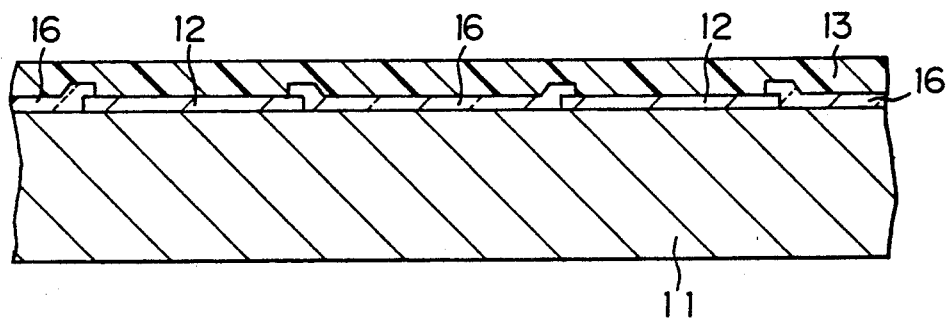
FIGS. 5a, 5b and 5c show steps in the preferred embodiment of the present invention.
Figure 5B:
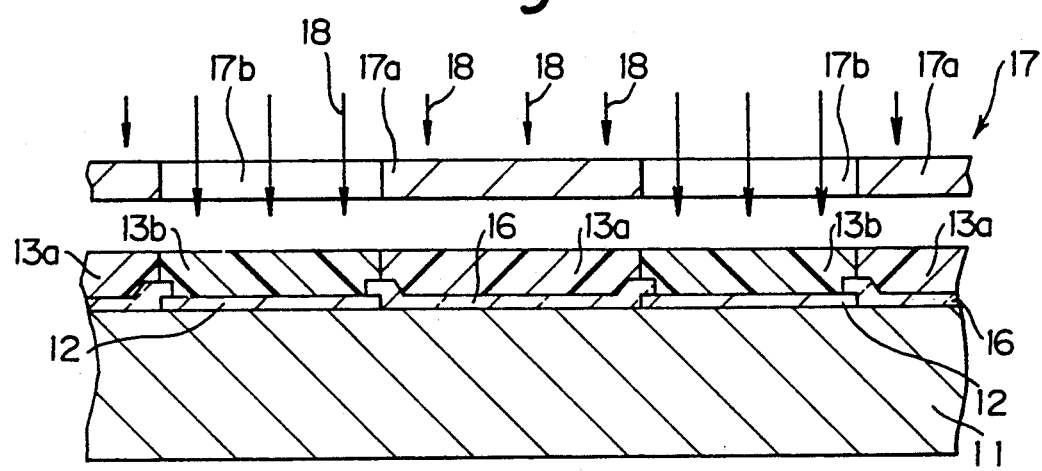
Figure 5C:
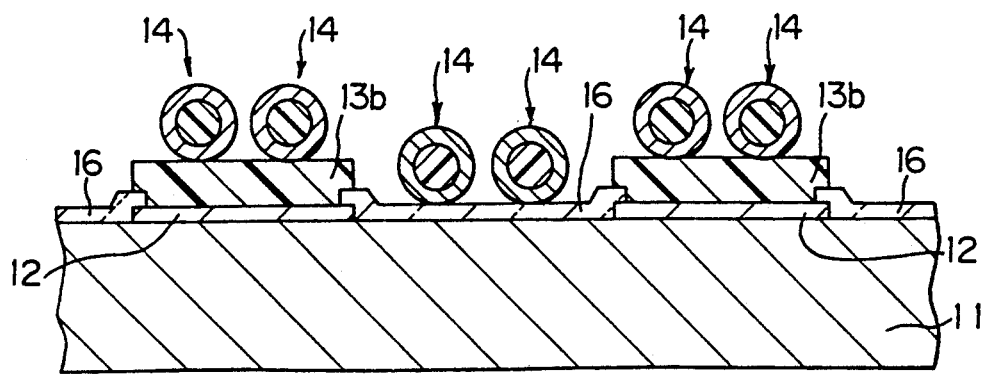

FIGS. 5a, 5b and 5c are cross-sectional views which serve to illustrate the process of forming connection electrodes of the semiconductor device 10 shown in FIG. 1.

As shown in FIG. 5a, the electrodes 12 and the surface protecting layer 16 are formed on the semiconductor substrate 11 in advance. A coat of photosetting resin is applied to the surfaces of the electrodes 12 and the protecting layer 16 by, for example, spin coating or roll coating, thereby forming a resin layer 13 over the electrodes 12 and the layer 16.

The resin layer 13 may be made of, for example, a material in which a photo-setting agent is mixed with a base material such as a thermoplastic resin of the acrylic or polyester type, a material in which a photoreactive radical is added to a base material, or a material in which a thermoplastic resin is mixed with a base material such as a photo-setting resin.

As shown in FIG. 5b, the resin layer 13 formed over the substrate 11 is illuminated by ultraviolet rays 18 through a mask 17. The mask 17 is provided with blocking portions 17a for blocking the ultraviolet rays 18 and openings 17b through which the ultraviolet rays 18 can pass. The pattern of the electrodes 12 on the substrate 11 and that of the openings 17b in the mask 17 are formed such that they can be made coincident with each other. After the mask 17 and the resin layer 13 have been aligned in a superimposed state, illumination with the ultraviolet rays 18 is effected. In this manner, only the portion of the resin layer 13b which correspond to the pattern of the electrodes 12 is hardened, while the portion which is not exposed to the ultraviolet rays 18 is not hardened.

Then, the resin layer 13 which has been selectively illuminated with the ultraviolet rays 18 is developed with a solvent. The solvent may be selected from among ketones such as acetone and methyl ethyl ketone or alcohols. In general, since the hardened resin does not easily dissolve in the solvent, the development is easy.

More specifically, in the portion of the resin layer 13b which is hardened by illumination with the ultraviolet rays 18, cross-linking reactions are caused by the ultraviolet rays 18. The hardened resin layer 13b exhibits little or no solubility with respect to the solvent. In contrast, since such a reaction does not occur in the portion of the resin layer 13a which is not hardened because of no exposure to the ultraviolet rays 18, the nonhardened portion can be easily dissolved and removed with the solvent. It is therefore possible to form the resin layer 13b on only the pattern on the electrodes 12.

Then, the substrate 11 is heated to approximately 50°-200° C., and the hardened resin layer 13b is again softened. In this state, as shown in FIG. 5c, the conductive particles 14 are scattered on and stuck to the resin layer 13b remaining on the pattern of the electrodes 12. Since the re-softened resin layer 13b has viscosity, the conductive particles 14 can adhere to them. In contrast, the conductive particles 14 are merely attracted to the portion from which the resin layer 13b is removed, for example, the surface protecting layer 16. Accordingly, unwanted conductive particles 14 which are attracted to the area other than the pattern of the electrodes 12 due to electrostatic force or the like, can be easily removed by means of an air blower, a brush or the like.

In the preferred embodiment, this removing operation is done after the scattering process. However, in another embodiment, the removing operation by means of an air blower can be done during the scattering of the conductive particles 14.

Each conductive particle 14, which has been disposed on the resin layer 13b of the electrodes 12 in the aforesaid manner, is partially embedded in the resin layer 13b in such a manner that a part of the portion of the conductive particle 14 embedded in the resin layer 13b is held in contact with the surface of the electrode 12, while the other part protrudes from the resin layer 13b. Alternatively, the semiconductor device 10 having the electrodes 12 on which the conductive particles 14 are disposed may be connected to another circuit substrate by pressure bonding in such a manner as to force the conductive particles 14 through the resin layer 13b to partially come into contact with the electrode 12 by the pressure applied to the semiconductor device 10 and the circuit substrate.

When corresponding electrodes are to be connected to each other via the conductive particles 14, an adhesive may be charged and hardened between the corresponding electrodes. Thus, the electrical connections are sealed by resin and the reliability of connection is improved.

Figure 8:
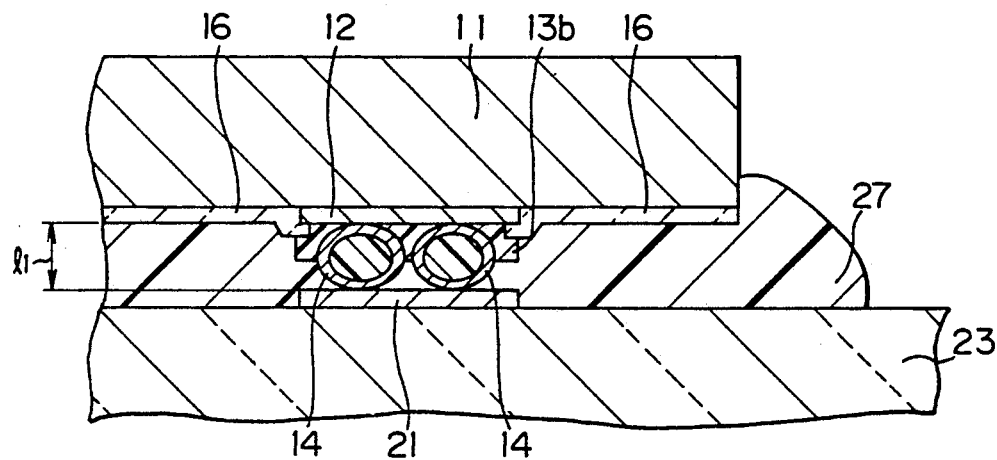
FIG. 8 is an enlarged cross-sectional view showing the details of the portion illustrated in FIG. 7.

FIG. 6 shows in cross section a liquid crystal display device 20 on which is mounted the semiconductor device 10 produced in the above-described manner. FIG. 7 is a cross section taken along line A—A of FIG. 6, and FIG. 8 is an enlarged diagram showing the details of the portion shown in FIG. 7.

As shown in FIG. 6, an electrode 21 and a plurality of opposing electrodes 22 are formed on the substrates 23 and 24, respectively, and the electrode 21 and the opposing electrodes 22 are opposed to each other by an intervening sealing resin 25. A liquid crystal 26 is charged between a pair of substrates 23 and 24.

The electrode 21 of the substrate 23 extend from the area occupied by the liquid crystal 26 into the right-hand side (as viewed in FIG. 6), and is connected via the conductive particles 14 to the semiconductor device 10 mounted for driving the liquid crystal display device 20. The connection between the substrate 23 and the semiconductor device 10 is sealed by the adhesive 27 as shown in FIGS. 7 and 8.

In the semiconductor device 10, a diffused layer is formed on the semiconductor substrate 11 (FIG. 1) made of silicon, gallium arsenide or the like to constitute a multiplicity of transistors and diodes. Accordingly, the semiconductor device 10 has the function of driving the liquid crystal display device 20.

The electrode 21 of the substrate 23 is made of, for example, a soda glass sheet. ITO (Indium Tin Oxide), ITO plated with Ni to reduce contact resistance, or the like is formed on the surface of the soda glass sheet. The thickness of the electrode 21 is usually approximately 50-200 mm.

Figure 9:
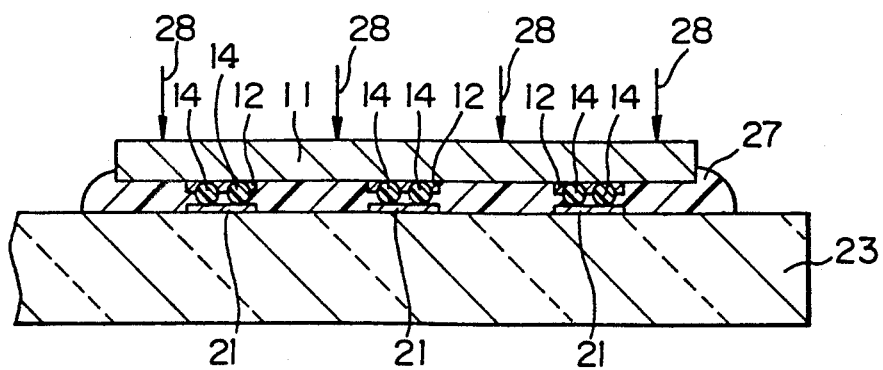
FIG. 9 is a cross-sectional view which serves to illustrate the process of mounting the semiconductor device formed according to the preferred embodiment on a liquid crystal display device by pressure bonding.

As shown in FIG. 9, the surface of the semiconductor device 10 on which projecting electrodes composed of the conductive particles 14 are formed, is positioned so as to oppose the surface of the substrate 23 on which the electrode 21 is formed. Then, the conductive particles 14 and the electrode 21 are aligned. The adhesive 27 is charged between the aligned substrates 11 and 23 and the conductive particles 14. The semiconductor device 10 is pressed against the substrate 23 via the conductive particles 14 and the adhesive 27 in the direction indicated by arrows 28 until the distance between the electrodes 12 and 21 reaches a predetermined gap 11 as shown in FIG. 8. In this pressed state, the adhesive 27 is hardened to mount the semiconductor device 10 on the substrate 23.

The adhesive 27 may be selected from among various adhesives such as reaction-curing adhesives, anaerobic curing adhesives, thermosetting adhesives and photosetting adhesives. In the above embodiment, since the substrate 23 is made of glass which is a transparent material, it is particularly effective to use a photosetting adhesive for rapid bonding as the adhesive 27.

Each of the embodiments has been explained with reference to the example in which the conductive particles 14 are disposed on the connection electrodes 12 on the semiconductor device 10. However, the present invention is not limited to the above semiconductor device and, for example, conductive particles may be disposed on the connection electrodes of other circuit substrates of various kinds for pressure bonding.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of producing projecting connection electrodes on a part of a conductive electrode pattern which is formed on a circuit substrate, said method comprising the steps of:
   forming a resin layer made of a resin material capable of being softened after being hardened, on said circuit substrate;
   curing only the resin layer material formed on connection electrodes of said conductive electrode pattern;
   leaving only the resin layer on said connection electrodes; and
   adhering conductive particles to only the resin layer on said connection electrodes by softening the resin layer and by scattering the conductive particles on said circuit substrate bearing the softened resin layer, each of said conductive particles having a diameter greater than the thickness of the softened resin layer.

2. A method as claimed in claim 1, wherein said curing step includes a step of effecting illumination with ultraviolet rays through a mask having an opening pattern corresponding to the connection electrodes.

3. A method as claimed in claim 2, wherein said leaving step includes a step of removing a non-cured part after the illumination with the ultraviolet rays.

4. A method as claimed in claim 3, wherein said removing step includes a step of dissolving the non-cured part by a solvent.

5. A method as claimed in claim 1, wherein said adhering step includes a step of removing the conductive particles attached to the portion other than the connection electrodes.

6. A method as claimed in claim 5, wherein said removing step being carried out after the scattering the conductive particles.

7. A method as claimed in claim 5, wherein said removing step being carried out simultaneously with the scattering the conductive particles.

8. A method as claimed in claim 1, wherein said adhering step includes a step of scattering, on the circuit substrate, conductive particles each completely formed of metal.

9. A method as claimed in claim 1, wherein said adhering step includes a step of scattering, on the circuit substrate, conductive particles each formed of an elastomeric particle coated with a metallic layer.

* * * * *